United States Patent [19]

Manocha et al.

[11] Patent Number: 5,068,207
[45] Date of Patent: Nov. 26, 1991

[54] METHOD FOR PRODUCING A PLANAR SURFACE IN INTEGRATED CIRCUIT MANUFACTURING

[75] Inventors: Ajit S. Manocha; Chen-Hua D. Yu, both of Allentown, Pa.

[73] Assignee: AT&T Bell Laboratories, Murray Hill, N.J.

[21] Appl. No.: 516,860

[22] Filed: Apr. 30, 1990

[51] Int. Cl.⁵ .................................................. H01L 21/469
[52] U.S. Cl. ............................... 437/231; 437/944; 437/235; 148/DIG. 100
[58] Field of Search ............................... 437/231, 944; 148/DIG. 100

[56] References Cited

U.S. PATENT DOCUMENTS 4,328,263  5/1982  Kurahashi et al. ............... 437/235
4,432,134  2/1984  Jones et al. ....................... 437/944

FOREIGN PATENT DOCUMENTS 268085     5/1989   Fed. Rep. of Germany.
58-077247  5/1983   Japan.
60-02835   3/1985   Japan.
61-288445 12/1986   Japan.

OTHER PUBLICATIONS

A. Bhattacharyya et al., "Lift-Off Insulator Process", IBM Technical Disclosure Bulletin, vol. 21, No. 9, Feb. 1979, pp. 3577–3578.
Research Disclosure-29110, "Stud Process Using Strippable Layer", Jul. 1988, p. 462.

Primary Examiner—Brian E. Hearn
Assistant Examiner—Laura M. Holtzman
Attorney, Agent, or Firm—Richard D. Laumann

[57] ABSTRACT

A planar surface is produced in integrated circuit processing by patterning a bilevel structure of a conductor and a sacrificial layer followed by directional deposition of a dielectric and lift off of the sacrificial layer. An additional dielectric layer may now be deposited if desired.

6 Claims, 1 Drawing Sheet

METHOD FOR PRODUCING A PLANAR SURFACE IN INTEGRATED CIRCUIT MANUFACTURING

TECHNICAL FIELD

This invention relates to a method of integrated circuit manufacturing which includes the step of producing a planar surface.

BACKGROUND OF THE INVENTION

As integrated circuits become more complex, the topography associated with the integrated circuits also becomes more complex, i.e., deviations from surface planarity become greater. The complex topography causes problems in manufacturing because, e.g., several levels of dielectrics and of metallizations are now frequently used in integrated circuit fabrication, and the topography becomes more complex as the number of levels increases. However, satisfactory metallizations are frequently difficult to obtain over very complicated topography due to factors, e.g. poor step coverage, which cause discontinuities in the metallization.

For this reason, as well as for other reasons, methods have been devised which planarize dielectric surfaces as preparation for subsequent processing steps. For example, mechanical polishing methods have been developed which yield generally good results but typically suffer from at least two drawbacks. First, particles are produced and, second, heat is generated. The particles may contaminate the devices being produced and the heat may undesirably alter device characteristics. Another method which has been developed is a planarization etchback. This method deposits a photoresist over a thick dielectric, typically a deposited oxide, and then etches back to produce a planar dielectric surface. The deposited photoresist has a planar surface and, because the etch has similar etch rates for the photoresist and the dielectric, the planar surface is retained by the etching process. However, the photoresist introduces sodium ions which are removed by a wet chemical etch thus adding complexity to the manufacturing process. Additionally, the wet etch etches low density oxides more rapidly than it etches high density oxides. This creates a problem because the oxide is not usually deposited with uniform density but rather has low density regions running in substantially vertical directions. Low density regions are most likely to be present when the oxide is deposited between closely spaced metal runners, such as are present in submicron lithography. The etch produces trenches in the low density regions, thereby resulting in a nonplanar surface.

There may also be situations in which a planar surface is desired which is only partially formed by a dielectric. For example, a planar surface formed by metal runners and a dielectric between the metal runners may be desired. That is, the surfaces of the dielectric and of the metal runners should be coplanar.

SUMMARY OF THE INVENTION

A method of integrated circuit manufacturing comprising the steps of patterning a bilevel structure on a substrate to expose selected portions of said substrate, said bilevel structure comprising a first material adjacent said substrate and sacrificial material on said first material; depositing a first dielectric in a direction substantially perpendicular to the substrate surface; and lifting off said sacrificial material. The dielectric covers no more than a portion of the sidewalls of the sacrificial layer. In a preferred embodiment, the first material comprises a conductor, such as a metal, polysilicon, or a metal silicide. The sacrificial material is typically wet etchable and lifting off is by wet etching. In a further preferred embodiment, the first dielectric is deposited to a thickness approximately equal to the thickness of the patterned conductor thereby producing a substantially planar surface, after lift off, formed by the coplanar metal and first dielectric surfaces. In another preferred embodiment, a second dielectric is deposited after the lift off step has been completed to produce a substantially planar dielectric surface. Regular device processing follows to complete fabrication of the integrated circuit.

For reasons of clarity, the elements of the integrated circuit depicted are not drawn to scale and only a portion of the integrated circuit is depicted.

DETAILED DESCRIPTION

Figure 1:
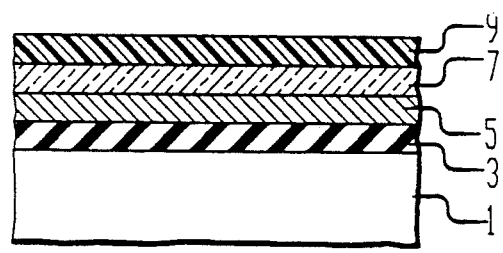
FIGS. 1-5 depict stages of an integrated circuit manufacturing process according to this invention.

FIG. 1 depicts a portion of an integrated circuit at an intermediate fabrication stage in one embodiment of this invention. Depicted are silicon layer 1, first dielectric layer 3, first material layer 5, sacrificial layer 7, and photoresist layer 9. The individual, active devices of the invention are fabricated in the silicon layer. These devices are well known to those skilled in the art and need not be depicted nor their fabrication described. The term "substrate" is used to mean a layer that lies underneath and supports an overlying layer. The term substrate is thus appropriately applied to dielectric layer 3 as it supports first material layer 5. Silicon layer 3 may be an epitaxial layer or it may be a wafer. Dielectric layer 3 typically comprises a deposited silicon oxide. Layer 5 comprises a conductor such as a metal, doped silicon, or a metal silicide. The metal may be aluminum, although the use of other metals, such as tungsten is also contemplated. If adhesion of the metal to the dielectric is a problem, a glue layer (not shown) may be used to improve adhesion. Sacrificial layer 7 is desirably wet etchable and comprises a readily available glass, such as thermal ozone TEOS, plasma enhanced TEOS with or without P or F, or a spin-on-glass (SOG). The sacrificial layer material must have a high etch rate differential with respect to the underlying metal and directionally deposited dielectric, and it should have a high etching rate in wet chemicals, such as an 8:1 ethylene glycol:-buffered HF. The term SOG is well known to those skilled in the art and refers generally to any disposable oxide. The photoresist is any conventional resist. Layers 5 and 7 form a bilevel structure.

Figure 2:
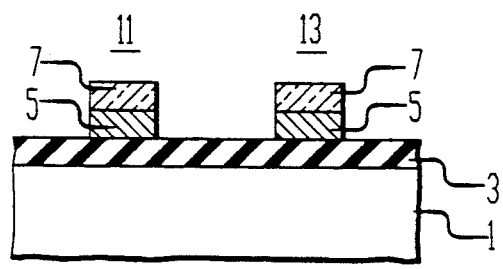

Conventional lithographic techniques are now used to pattern the bilevel structure; i.e., to expose selected portions of the substrate. After patterning, the photoresist is removed and the structure depicted in FIG. 2 is obtained. Two conductor runners 11 and 13 are shown. The spacing between the runners is not critical to the practice of this invention. However, smaller spacings will require greater directional deposition than will larger spacings.

Figure 3:
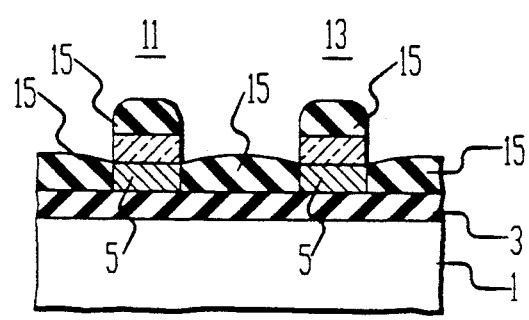

A directional deposition technique is now used to deposit a dielectric, typically an oxide, shown as element 15 in FIG. 3. The deposition technique should not result in conformal deposition, and the direction of the deposition is perpendicular to the substrate surface. Exemplary deposition techniques include electron cyclotron resonance(ECR) and plasma enhanced chemical vapor deposition(PECVD). Those skilled in the art will readily understand and implement these techniques and will know of still other deposition techniques. The deposition is desirably performed at relatively low pressure to increase the directionality of the deposition by, e.g. reducing particle scattering, which, as will be readily appreciated, tends to decrease the directionality of the deposition and may result in unwanted sidewall deposition. Those skilled in the art will readily select an appropriate pressure which will depend upon technique and apparatus. The dielectric is typically deposited to a thickness that is approximately equal to the thickness of the patterned conductor layer. The dielectric should cover no more than a portion of the sidewalls of the sacrificial layer. Some variation from this thickness is permissible if the loss of coplanarity between the dielectric surface and the metal surface is acceptable. However, the dielectric 13 should not be so thick as to completely cover the sidewalls of the sacrificial layer 7. Monitoring of the deposition time is a convenient method for monitoring the dielectric thickness.

Figure 4:
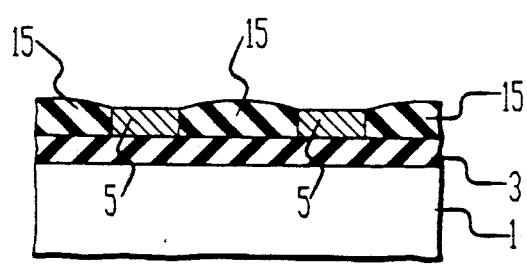

An etch, preferably wet, is now used to lift off the sacrificial layer and the dielectric deposited on the sacrificial layer. To expedite processing, the wet etch should have a high etch rate. There should also be a high etch rate differential between the directionally deposited dielectric and the conductor and the sacrificial layer; the etch rate differential is desirably at least 10:1; i.e., the sacrificial layer should etch at a rate at least 10 times greater than the etch rate for the other materials. Buffered HF acid is an exemplary etchant. After lift off has been completed, the structure depicted in FIG. 4 is obtained.

Figure 5:
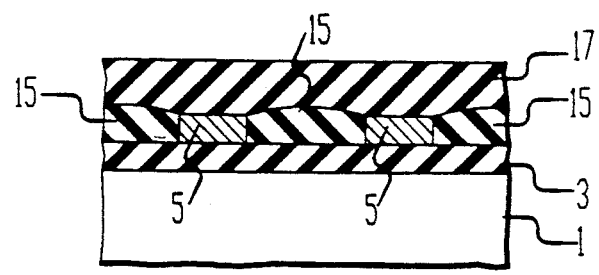

Further processing may now be performed. For example, a dielectric layer 17 is now deposited to yield the structure depicted in FIG. 5. This dielectric may be an oxide, etc., and is deposited by any convenient technique. A planar dielectric surface has now been obtained and, still further, integrated circuit processing may be performed. The term planar is used to mean local planarity, i.e., the surface is relatively planar on a horizontal scale of 10 $\mu$m; global deviations may be present as the dielectric may not have a planar surface across the entire wafer. Local deviations from planarity are minimized by mass transfer of the deposited dielectric which fills in the low points.

Variations in the embodiments described are contemplated. For example, the processing sequence described may be repeated two or more times during the fabrication of the integrated circuit. A conductor layer and a sacrificial layer may be sequentially deposited and patterned. A dielectric is then directionally deposited, etc. Still other variations will be thought of by those skilled in the art.

We claim:

1. A method of integrated circuit manufacturing comprising the steps of patterning a bilevel structure on a substrate to expose selected portions of said substrate, said bilevel structure comprising a conductor layer adjacent to said substrate and a sacrificial layer on said conductor layer, said sacrificial layer material comprises a glass;

depositing a first dielectric in a direction substantially perpendicular to the substrate surface, said first dielectric covering no more than a portion of the sidewalls of said sacrificial layer; and, lifting off said sacrificial layer by wet etching to leave said first dielectric on said substrate.

2. A method as recited in claim 1 in which said glass comprises a spin on glass.

3. A method as recited in claim 1 comprising the further step of depositing a second dielectric after said lifting off step.

4. A method as recited in claim 1 in which said conductor comprises a metal.

5. A method as recited in claim 1 in which said conductor comprises a silicide.

6. A method as recited in claim 1 in which said conductor comprises a doped silicon.

* * * * *